(12) United States Patent
Tamura et al.

(10) Patent No.: US 11,525,556 B2
(45) Date of Patent: Dec. 13, 2022

(54) LIGHT EMITTING DEVICE

(71) Applicant: NICHIA CORPORATION, Anan (JP)

(72) Inventors: Takeshi Tamura, Anan (JP); Hiroshi Fujimori, Chino (JP); Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/356,238

(22) Filed: Jun. 23, 2021

(65) Prior Publication Data
US 2021/0317971 A1 Oct. 14, 2021

Related U.S. Application Data

(63) Continuation of application No. 16/878,191, filed on May 19, 2020, now Pat. No. 11,047,551, which is a
(Continued)

(30) Foreign Application Priority Data

Jul. 20, 2016 (JP) .................. 2016-142850
Jul. 11, 2017 (JP) .................. 2017-135184

(51) Int. Cl.
*F21V 13/08* (2006.01)
*G02F 1/13357* (2006.01)
(Continued)

(52) U.S. Cl.
CPC .............. *F21V 13/08* (2013.01); *F21V 3/02* (2013.01); *F21V 7/0083* (2013.01); *F21V 9/08* (2013.01);
(Continued)

(58) Field of Classification Search
CPC ... F21V 13/08; F21V 3/02; F21V 9/08; F21V 7/24; G01F 1/133605; G01F 1/133602;
(Continued)

(56) References Cited

U.S. PATENT DOCUMENTS 8,251,546 B2 8/2012 Chen et al.
8,390,760 B2 3/2013 Ogihara et al.
(Continued)

FOREIGN PATENT DOCUMENTS

EP 2484963 A1 8/2012
JP 2004-311353 A 11/2004
(Continued)

OTHER PUBLICATIONS

English Translation, WO 2009/110379, Sep. 2009, Takahashi et al. (Year: 2009).*

(Continued)

*Primary Examiner* — Peggy A Neils
(74) *Attorney, Agent, or Firm* — Global IP Counselors, LLP

(57) ABSTRACT

A light emitting device includes a substrate, a plurality of light sources, a partitioning member and a diffuser sheet. The light sources are disposed on an upper surface of the substrate. The partitioning member is disposed on the upper surface of the substrate and including top parts. The partitioning member is reflective. The diffuser sheet is in contact with the top parts of the partitioning member.

20 Claims, 6 Drawing Sheets

Related U.S. Application Data continuation of application No. 16/352,388, filed on Mar. 13, 2019, now Pat. No. 10,670,233, which is a continuation of application No. 15/648,729, filed on Jul. 13, 2017, now Pat. No. 10,274,168.

(51) Int. Cl.

| | | |
|---|---|---|
| *H01L 25/075* | (2006.01) | |
| *F21V 3/02* | (2006.01) | |
| *F21V 7/00* | (2006.01) | |
| *F21V 9/08* | (2018.01) | |
| *H01L 33/60* | (2010.01) | |
| *G02F 1/1335* | (2006.01) | |
| *F21Y 115/10* | (2016.01) | |

(52) U.S. Cl.
CPC .. *G02F 1/133602* (2013.01); *G02F 1/133603* (2013.01); *G02F 1/133605* (2013.01); *G02F 1/133608* (2013.01); *G02F 1/133611* (2013.01); *H01L 25/0753* (2013.01); *F21Y 2115/10* (2016.08); *G02F 1/133607* (2021.01); *H01L 33/60* (2013.01)

(58) Field of Classification Search
CPC ......... G01F 1/133603; G01F 1/133608; G01F 1/133611; G01F 2001/133607; H01L 25/0753; H01L 33/60; F21Y 2115/10; G02F 1/133605; G02F 1/133602; G02F 1/133603; G02F 1/133608; G02F 1/133611; G02F 2001/133607
See application file for complete search history.

(56) References Cited

U.S. PATENT DOCUMENTS

| | | | |
|---|---|---|---|
| 8,469,530 | B2 | 6/2013 | Ito et al. |
| 8,721,115 | B2 | 5/2014 | Ing et al. |
| 9,134,011 | B2 | 9/2015 | Jo et al. |
| 9,494,823 | B2 | 11/2016 | Brown Elliott |
| 9,939,680 | B2 | 4/2018 | Cho et al. |
| 10,353,223 | B2 | 7/2019 | Kim et al. |
| 10,539,733 | B2 | 1/2020 | Yamamoto et al. |
| 10,754,189 | B2 | 8/2020 | Kuniyasu et al. |
| 2005/0219836 | A1 | 10/2005 | Hung |
| 2007/0103935 | A1* | 5/2007 | Masuyama ............... F21V 7/08 362/612 |
| 2009/0045416 | A1 | 2/2009 | Bierhuizen et al. |
| 2010/0102743 | A1 | 4/2010 | Hou et al. |
| 2010/0141867 | A1 | 6/2010 | Ogihara et al. |
| 2010/0246160 | A1 | 9/2010 | Ito et al. |
| 2013/0169905 | A1 | 7/2013 | Ouchi et al. |
| 2014/0085927 | A1 | 3/2014 | Ito et al. |
| 2014/0124812 | A1 | 5/2014 | Kuramoto et al. |
| 2015/0036317 | A1 | 2/2015 | Yamamoto et al. |
| 2017/0045779 | A1 | 2/2017 | Kamiyoshihara et al. |
| 2018/0372300 | A1 | 12/2018 | Ohkawa |

FOREIGN PATENT DOCUMENTS

| | | | | |
|---|---|---|---|---|
| JP | 2005-284283 | A | 10/2005 | |
| JP | 2009-158210 | A | 7/2009 | |
| JP | 2009-170205 | A | 7/2009 | |
| JP | 2009150940 | A | 7/2009 | |
| JP | 2009-283438 | A | 12/2009 | |
| JP | 2010-135204 | A | 6/2010 | |
| JP | 2010-238420 | A | 10/2010 | |
| JP | 2010-272245 | A | 12/2010 | |
| JP | 2011-129371 | A | 6/2011 | |
| JP | 2011-151002 | A | 8/2011 | |
| JP | 2013-025945 | A | 2/2013 | |
| JP | 2014-067681 | A | 4/2014 | |
| JP | 2015-032373 | A | 2/2015 | |
| JP | 2015-095488 | A | 5/2015 | |
| WO | WO-2009110379 | A1 * | 9/2009 | ....... G02F 1/133605 |
| WO | 2010-123284 | A2 | 10/2010 | |

OTHER PUBLICATIONS

Extended European Search Report of the corresponding European Patent Application No. 17181094.8, dated Sep. 14, 2017.
Non Final Office Action in the related U.S. Appl. No. 15/648,729, dated Aug. 9, 2018.
Notice of Allowance in the related U.S. Appl. No. 15/648,729, dated Dec. 14, 2018.
Non Final Office Action in the related U.S. Appl. No. 16/352,388, dated Sep. 9, 2019.
Notice of Allowance in the related U.S. Appl. No. 16/352,388, dated Jan. 27, 2020.
Corrected Notice of Allowance in the related U.S. Appl. No. 16/352,388, dated May 4, 2020.
Non Final Office Action in the related U.S. Appl. No. 16/878,191, dated Sep. 24, 2020.
Notice of Allowance in the related U.S. Appl. No. 16/878,191, dated Mar. 2, 2021.

* cited by examiner

LIGHT EMITTING DEVICE

CROSS-REFERENCE TO RELATED APPLICATIONS

This application is a continuation application of U.S. patent application Ser. No. 16/878,191, filed on May 19, 2020, which is a continuation application of U.S. patent application Ser. No. 16/352,388, filed on Mar. 13, 2019, now U.S. Pat. No. 10,670,233, which is a continuation application of U.S. patent application Ser. No. 15/648,729, filed on Jul. 13, 2017, now U.S. Pat. No. 10,274,168. This application claims priority to Japanese Patent Application No. 2016-142850 filed on Jul. 20, 2016, and Japanese Patent Application No. 2017-135184 filed on Jul. 11, 2017. The entire disclosures of U.S. patent application Ser. Nos. 15/648,729, 16/352,388 and 16/878,191, and Japanese Patent Application Nos. 2016-142850 and 2017-135184 are hereby incorporated by reference in their entirety.

BACKGROUND

The present disclosure relates to a light emitting device.

The surface-light emitting device in Japanese Patent Publication No. 2013-25945 is a known example of a direct-illumination backlight used in liquid crystal television, and the like.

The light emitting device disclosed in Japanese Patent Publication No. 2013-25945 has a peripheral wall around a plurality of light sources, and has a frame that is disposed in a matrix shape. This divides the emission area and discourages or prevents light from leaking outside of the area, while allowing for local dimming (also called partial drive) with which the amount of light emission is controlled for each light source to raise the contrast ratio within the plurality of areas.

SUMMARY

When light sources are locally dimmed with such a surface-light emitting device, the light that has been emitted from the light sources in lit areas and then guided and scattered by a diffuser sheet or the like is incident on the unlit areas adjacent to the lit areas, thereby reducing the contrast ratio between the lit and unlit areas.

A light emitting device includes a substrate, a plurality of light sources, a partitioning member and a diffuser sheet. The light sources are disposed on an upper surface of the substrate. The partitioning member is disposed on the upper surface of the substrate and including top parts. The partitioning member is reflective. The diffuser sheet is in contact with the top parts of the partitioning member.

A certain embodiment of the present disclosure can realize a surface-light emitting device with which the contrast ratio between lit areas and unlit areas can be increased.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings.

DESCRIPTION

Figure 1A:
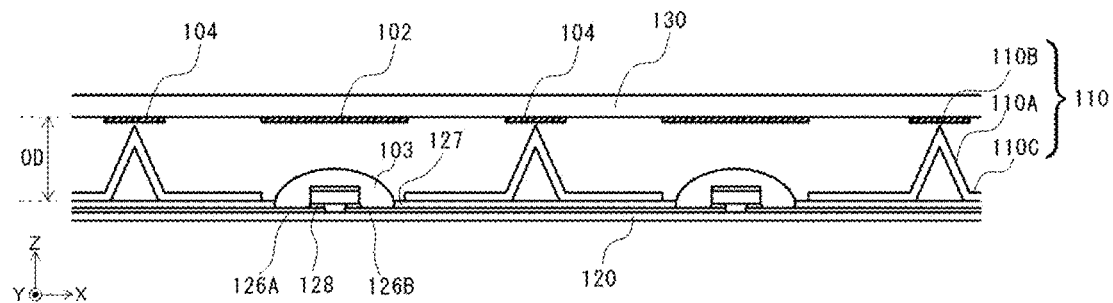
FIG. 1A is a schematic cross section showing a light emitting device of certain embodiments of the present disclosure.

Embodiments of the present disclosure will now be described through reference to the drawings. However, the light emitting device and so forth described below are intended to be specific examples of the technological concept of the present disclosure, and unless otherwise specified, the present disclosure is not limited to or by what follows. Also, what is described in one embodiment or working example is applicable to another embodiment or working example.

The size, positional relations, and so forth of the members shown in the drawings may be exaggerated to make the description more clear.

First Embodiment

The light emitting device of an embodiment of the present invention will now be described through reference to FIG. 1A.

FIG. 1A is a schematic cross section of the overall configuration of the light emitting device. The light emitting device of an embodiment of the present disclosure includes a mounting board 120 on which a plurality of light sources 103 are disposed, a partitioning member 110 including a plurality of areas that surround the light sources 103 and are formed by walls 110A having top parts 110B, a diffuser sheet 130 provided above the partitioning member 110, first reflectors 102 that are provided directly above the light sources 103 and positioned on an upper surface or a lower surface of the diffuser sheet 130, and a second reflector 104 that is provided directly above the top parts and is disposed on the upper surface or the lower surface of the diffuser sheet 130.

In this Specification, the term "light source" refers to a member that emits light, and refers not only a light emitting element that emits light by itself, but also to a component of encapsulating a light emitting element with a light-transmissive resin or the like, or to a packaged surface-mount light emitting device (also called an LED). In this embodiment, for example, the light sources 103 is a component in which a light emitting element 108 is covered with an encapsulant 124.

Figure 2:
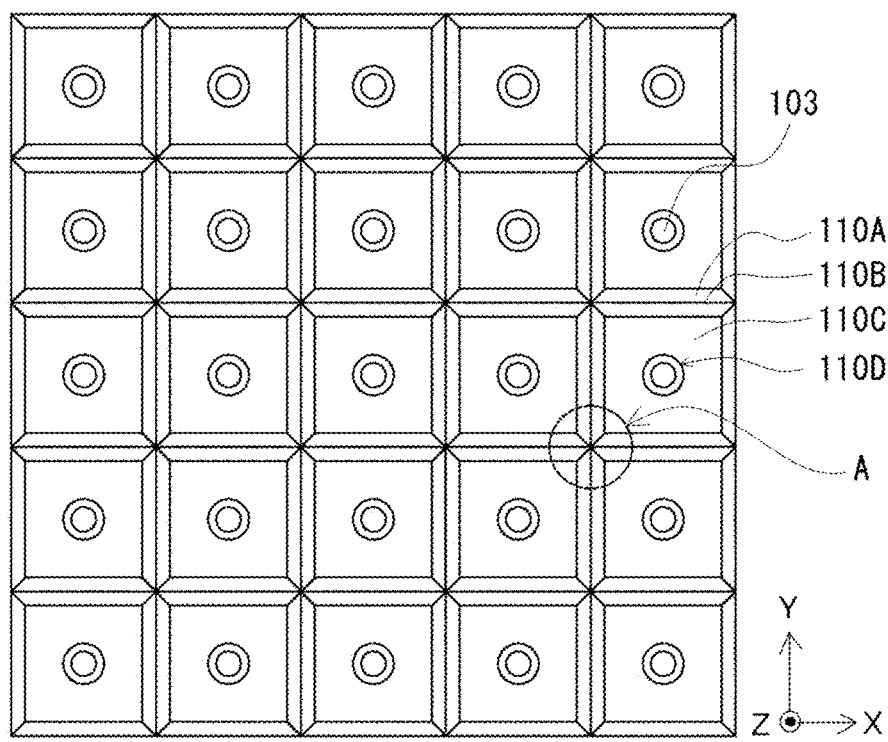
FIG. 2 is a schematic top view of part showing the light emitting device of the first embodiment of the present disclosure.

FIG. 2 is a schematic top view of the light emitting device when the diffuser sheet 130 has been removed. In this embodiment, five of the light sources 103 are disposed in the X direction, and five in the Y direction, for a total of 25 of them in a matrix. In the top view, the light emitting device is divided into a plurality of substantially square areas by the partitioning member 110 disposed over the mounting board 120, and the light sources 103 are each disposed in the approximate center of the divided area.

The partitioning member 110 is reflective to light, and light emitted from the light sources 103 can be efficiently reflected by the walls 110A. In this embodiment, the partitioning member 110 has bottom surfaces 110C and the walls 110A that include the top parts 110B. The partitioning member 110 has a concave shape formed by the bottom surfaces 110C and the walls 110A, and has through-holes 110D in the approximate centers of the bottom surfaces 110C. As shown in FIG. 1A, the light sources 103 are disposed in such a manner as to pass through the through-holes 110D in the bottom surfaces 110C from the lower side, so that the upper surfaces of the light sources 103 are disposed higher than the bottom surfaces 110C. Consequently, light emitted from the light sources 103 can be efficiently reflected by the walls 110A.

The shape and size of the through-holes 110D need only be such that the light sources 103 are entirely exposed. Furthermore, the through-holes 110D are preferably formed such that their outer edges are located only near the light sources 103, so that light from the light sources can also be reflected by the bottom surfaces 110C.

The partitioning member 110 may be formed of a resin containing at least one reflective material composed of titanium oxide, aluminum oxide, silicon oxide, or other such metal oxide particles, or may be formed from a resin that does not contain a reflective material, and a reflective material then provided over the surface. It is preferable for the reflectivity to be at least 70% with respect to the light emitted from the light sources 103.

The partitioning member 110 can be formed, for example, by using a metal mold, or by optical shaping. Injection molding, extrusion molding, compression molding, vacuum molding, compressed air molding, press molding, or another such molding method can be applied as the method for forming with a metal mold. For example, a partitioning member 110 in which the bottom surfaces 110C and the walls 110A are integrally formed can be obtained by vacuum molding using a reflective sheet formed from PET or the like. The thickness of the reflective sheet is in a range of 100 μm to 300 μm, for example.

The walls 110A formed surrounding the light sources 103 preferably include surfaces that are inclined in such a manner as to spread out from the bottom toward the top with respect to the upper surface of the mounting board 120 and the bottom surfaces 110C.

The lower surfaces of the bottom surfaces 110C of the partitioning member 110 are fixed with an adhesive member or the like to the upper surface of the mounting board 120. It is preferable to fix around the through-holes 110D with the adhesive member such that light emitted from the light sources 103 is not incident between the mounting board 120 and the partitioning member 110. For example, a ring-shaped adhesive member is preferably disposed around the outer edges of the through-holes 110D. The adhesive member may be double-sided tape, or a hot-melt adhesive sheet, or an adhesive liquid such as a thermosetting resin or a thermoplastic resin. These adhesive members preferably have very high flame retardant. Also, the fixing may be performed with screws instead of adhesive members.

Figure 4:
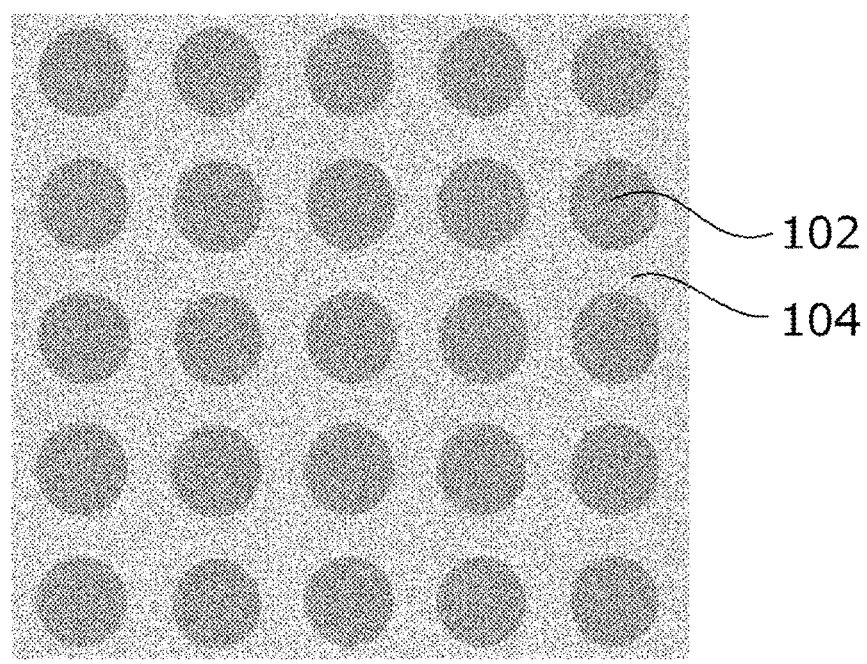
FIG. 4 is schematic diagrams showing an example of a reflection pattern with a diffuser sheet of the first embodiment of the present disclosure.

The light emitted from the light sources 103 is reflected by the walls 110A and the bottom surfaces 110C, and is incident on the diffuser sheet 130 disposed above the partitioning member. As shown in FIG. 4, a reflective pattern including the first reflectors 102 and the second reflector 104 is formed on the surface of the diffuser sheet 130. In the example in FIG. 4, the first reflectors 102 are formed directly above the light sources 103, and the second reflector 104 is formed over entire portion other than the portions that first reflectors 102 are formed. In this Specification, the reflectivity of the reflective pattern is depicted by contrast in the drawings, with darker color indicating a higher reflectivity than a lighter color.

The first reflectors 102 are disposed directly above the light sources 103. Because the distance OD between the light sources 103 and the diffuser sheet 130 is shortest in the areas directly above the light sources, the luminance is higher in these areas. In particular, the shorter the distance between the light sources 103 and the diffuser sheet 130 is, the less uniform the luminance between the areas directly above the light sources and the other areas is. Providing the first reflectors 102 on the surface of the diffuser sheet 130 allows part of the light with high directionality from the light sources 103 to be reflected and returned to the light source 103 direction, which cuts down on non-uniform luminance.

Furthermore, in this embodiment, the second reflector 104 is disposed not only directly above the light sources 103, but also directly above the areas in which the top parts 110B of the partitioning member 110 are disposed, which are areas that are not directly above the light sources 103. The top parts 110B serve as the boundary between the lit and unlit areas during local dimming of the light sources 103.

Figure 9:
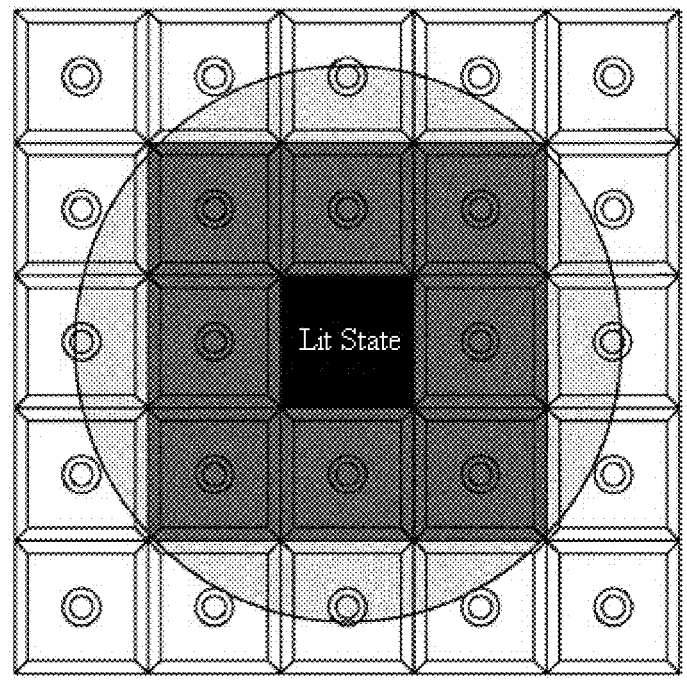
FIG. 9 is a diagram illustrating an effect of an embodiment of the present disclosure.

Light from the lit areas are scattered and guided by the diffuser sheet 130 and are incident in the adjacent unlit areas, thereby lowering the contrast ratio between the lit and unlit areas. FIG. 9 is a simulation of the surface luminance when light is incident in unlit areas adjacent to a lit area. Once light is incident in unlit areas, it is reflected by the walls 110A and the bottom surfaces 110C and guided to all of the unlit areas, so that unlit areas end up shining in the same way, and this lowers the contrast ratio.

Figure 10:
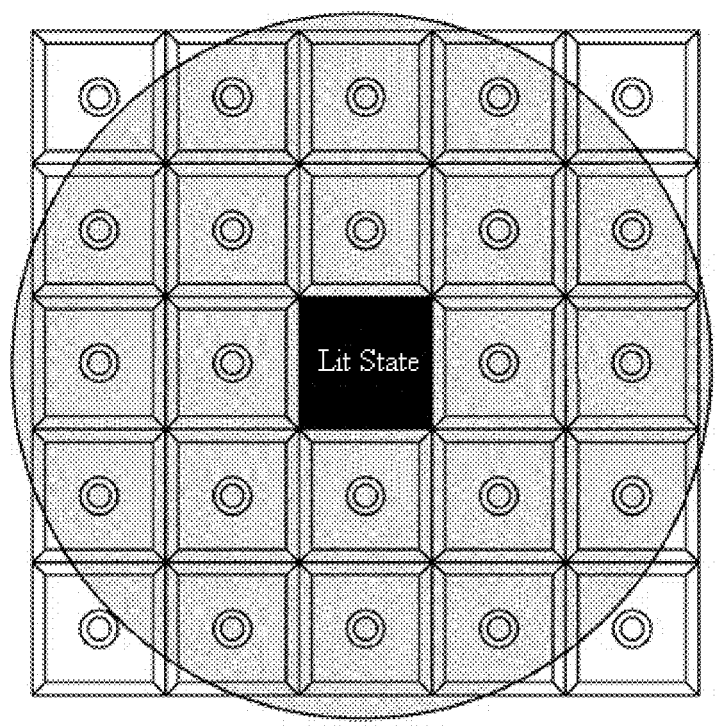
FIG. 10 is a diagram illustrating an effect of an embodiment of the present disclosure.

In this embodiment, since the first reflectors 102 and the second reflector 104 are disposed on the surface of the diffuser sheet 130, the light reflected or scattered by the diffuser sheet 130 can be reflected straight up from the light sources 103 by the first reflectors 102 and the second reflector 104 over the unlit places. FIG. 10 is a simulation of the surface luminance when light is directed upward by the second reflector 104, without being incident in the unlit areas. With this embodiment, the amount of light that is incident in unlit areas adjacent to a lit area can be reduced, and the contrast ratio can be increased. The light that has been scattered and reflected upward by the second reflector 104 is attenuated by the distance from the light sources 103, so it is less likely that a large amount of light will be in any particular unlit area.

Figure 5:
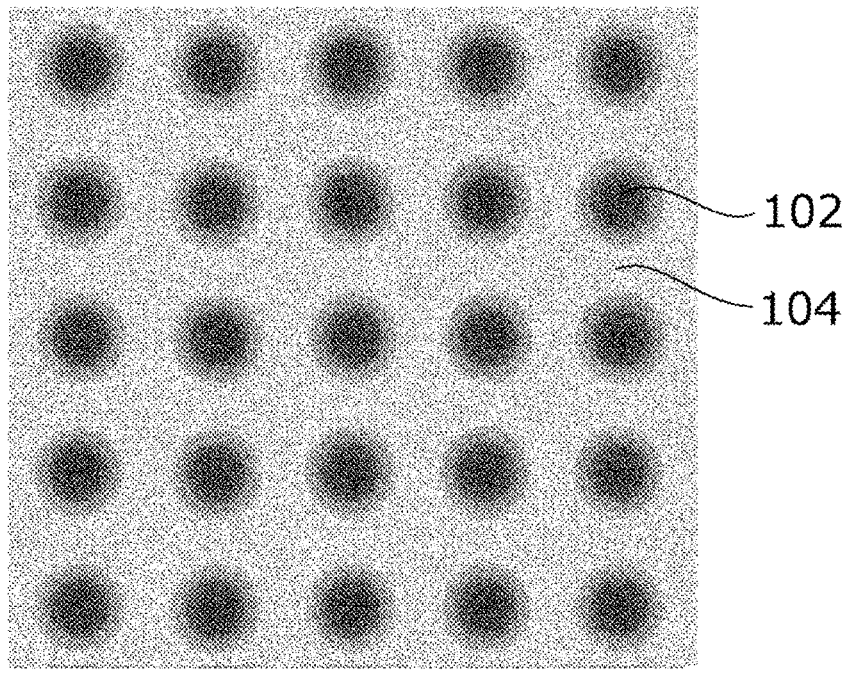
FIG. 5 is schematic diagrams showing an example of another reflection pattern with a diffuser sheet of the first embodiment of the present disclosure.

The pattern in which the first reflectors 102 and the second reflector 104 are formed on the surface of the diffuser sheet 130 is not limited to the example in FIG. 4, and the contrast ratio can be increased as long as there is a reflector directly above the light sources 103 and directly above the top parts 110B. As shown in FIG. 5, the reflectivity of the first reflectors 102 may be set such that reflectivity of each of the first reflectors 102 decreases toward the outside of each of the first reflectors 102.

The first reflectors 102, the second reflector 104, and third reflectors 106 discussed below can be formed by coating the diffuser sheet 130 with a resin containing a reflective material composed of titanium oxide, aluminum oxide, silicon oxide, or other such metal oxide particles. Also, in addition to a reflective material, the resin can also contain a pigment, a light absorbing material, or a phosphor. In the case of using a photocurable resin whose main ingredient is an acrylate, an epoxy, or the like, the diffuser sheet 130 can be coated with the resin, and thereafter the coating can be made to adhere by being irradiated with ultraviolet rays, for example. Also, photocuring can be performed with the light emitted from the light sources 103. The resin can be applied by inkjet method or by a printing method involving the use of a plate. Also, the first reflectors 102, the second reflector 104, and the third reflectors 106 discussed below can be formed by affixing the diffuser sheet 130 to a sheet of white PET, etc., in which a plurality of openings have been made for adjusting the reflectivity.

Here, the reflectivity of the first reflectors 102 and the second reflector 104 may be the same or different. In the case that the reflectivity is to be different, the second reflector 104 is preferably set to a lower reflectivity than the first reflectors 102. The portion that is the boundary between the lit and unlit areas during local dimming is the farthest away from the light sources 103, and there is less illumination from the light sources 103, thus this portion is dark. Thus, by lowering the reflectivity more than in other portions and raising the luminance directly above the top parts 110B, the boundary between two adjacent areas can be less distinguishable when these two areas are lit.

Figure 1B:
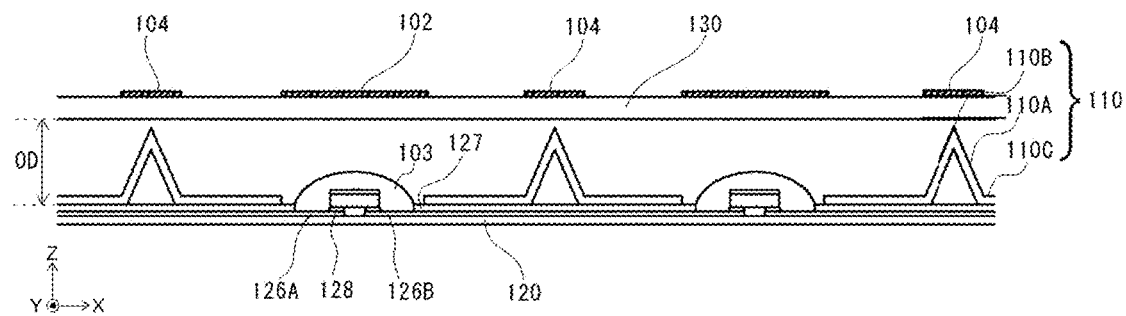
FIG. 1B is a schematic cross section showing the light emitting device of a modification example of the first embodiment of the present disclosure.
Figure 1C:
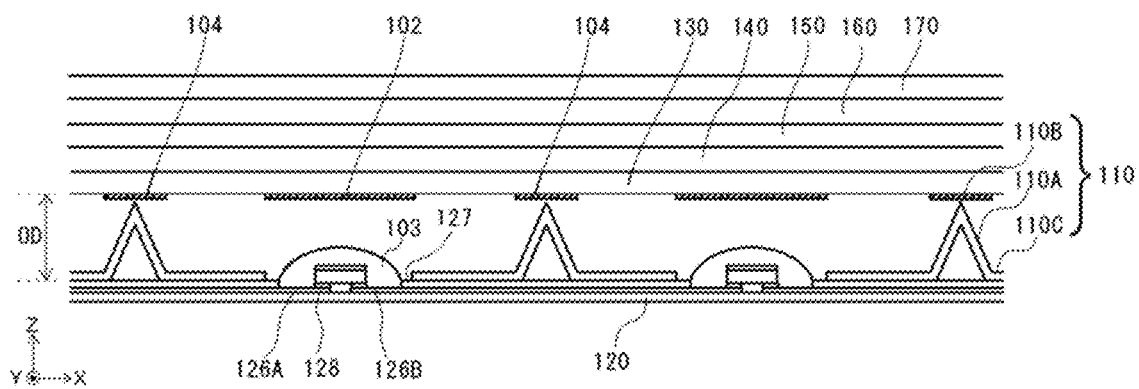
FIG. 1C is a schematic cross section showing a light emitting device that includes optical members and a wavelength conversion sheet.
Figure 1D:
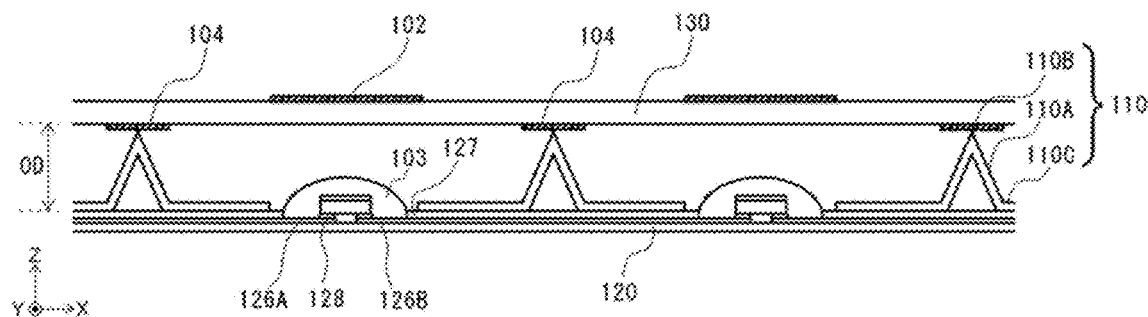
FIG. 1D is a schematic cross section showing a light emitting device of a modification example of the first embodiment of the present disclosure.
Figure 1E:
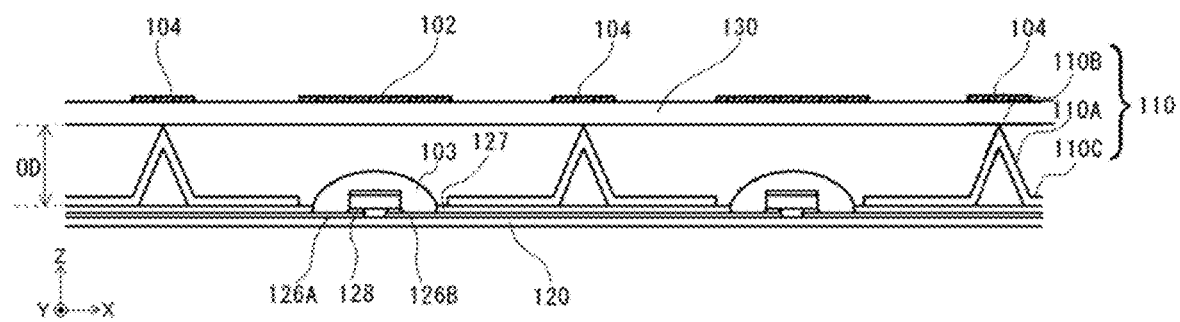
FIG. 1E is a schematic cross section showing a light emitting device of a modification example of the first embodiment of the present disclosure.

Also, as shown in FIG. 1E, the diffuser sheet 130 is preferably positioned above the top parts 110B and supported directly by one or more of the top parts 110B of the partitioning member 110. As shown in FIG. 1D, in the case where the second reflector 104 is positioned on the lower surface of the diffuser sheet 130, the second reflector 104 is in contact with one or more of the top parts 110B. This discourages or prevent the light emitted by the light sources 103 from passing between the diffuser sheet 130 and the top parts 110B, and form being incident in the unlit areas adjacent to the lit area, thereby being able to increase the contrast ratio.

The first reflectors 102 are preferably disposed inside the area demarcated by the partitioning member 110. This is because the light emitted from the light sources 103, which is repeatedly reflected and scattered by the first reflectors 102 and the partitioning member 110, tends to escape between the top parts 110B and the first reflectors 102, thereby making it difficult to decrease the luminance of a lit area.

Any light distribution characteristics of the light sources 103 may be applied, but a wide distribution is preferable in order to reflect light at each one of the areas bounded by the walls 110A with less non-uniform luminance. In particular, each of the light sources 103 preferably has a batwing light distribution. This can achieve a reduced amount of light emitted directly upward from the light sources 103, and wider light distribution from the individual light sources. The light spreading out strikes on the walls 110A and the bottom surfaces 110C, thereby allowing for a reduction in non-uniform luminance in each one of the areas bounded by the walls 110A.

Figure 3:
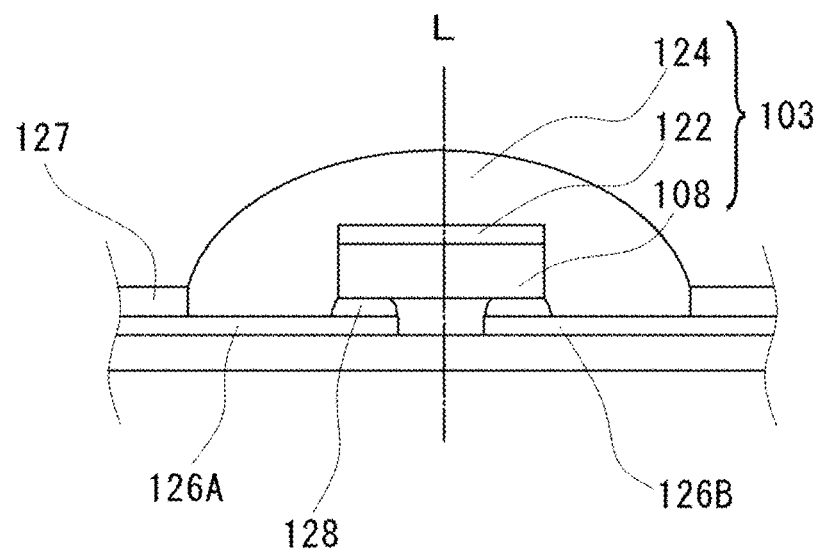
FIG. 3 is a schematic cross section showing an embodiment of a light source of the present disclosure.

The batwing light distribution mentioned here is defined by an emission intensity distribution in which, assuming the optical axis L to be 0°, the emission intensity at an angle at which the absolute value of the light distribution angle is greater than 0° is greater than the one at 0°. As shown in FIG. 3, the optical axis L is defined as a line that passes through the center of the light source 103 and is perpendicular to a line in the plane of the mounting board 120.

As shown in FIG. 3, for example, a light source in which a light emitting element 108 having a light reflecting film 122 on its upper surface is covered by the encapsulant 124 can be used as a light source 103 having a batwing light distribution. The light reflecting film 122 formed on the upper surface of the light emitting element 108 may be a metal film or may be a dielectric multilayer film (i.e., DBR film). Consequently, light traveling in the upward direction of the light emitting element 108 is reflected by the light reflecting film 122, the amount of light directly above the light emitting element 108 is reduced, and a batwing light distribution can be achieved. Since the light reflecting film 122 can be formed directly on the light emitting element 108, no batwing lens is necessary, making it possible to reduce the thickness of the light source 103.

For instance, the height of the light emitting element 108 mounted directly on the mounting board 120 is in a range of 100 μm to 500 μm, and the thickness of the light reflecting film 122 is in a rage of 0.1 μm to 3.0 μm. Even including the encapsulant 124 discussed below, the thickness of the light source 103 can be in a range of about 0.5 mm to about 2.0 mm. The height of the partitioning member 110 that is combined with such a light source 103 is 8.0 mm or less, and in case of a thinner light emitting device to be obtained, in a range of about 1.0 mm to about 4.0 mm is preferable, and if the distance to the diffuser sheet 130 is set to about 8.0 mm or less, and a thinner light emitting device is to be obtained, in a range of about 2.0 mm to about 4.0 mm is preferable. This allows for a backlight unit including the diffuser sheet 130 and other such optical members to be sufficiently thin.

The light reflecting film 122 preferably has reflectivity angle dependence to the angle of incidence for the emission wavelength of the light emitting element 108. More specifically, the reflectivity of the light reflecting film 122 is set to be lower for oblique incidence than for perpendicular incidence. This affords a more gentle change in luminance directly above the light emitting element, and discourages or prevents creating extremely dark areas, such as occurrence of a dark spot directly above the light emitting element.

As shown in FIG. 3, the light emitting element 108 is flip-chip mounted via joining members 128, straddling a pair of positive and negative conductive wiring 126A and 126B provided to the upper surface of the mounting board 120. An underfill may be disposed between the lower surface of the light emitting element 108 and the upper surface of the mounting board 120. A light reflecting layer 127, such as a white resist, may be formed in an area of the conductive wiring 126A and 126B where there is no electrical connection. The individual light sources 103 disposed on the mounting board 120 can be driven independently, and light control can be performed for each light source (e.g., local dimming or HDR).

The encapsulant 124 that covers the light emitting element is a light-transmissive member, and is provided in such a manner as to cover the light emitting element 108. The encapsulant 124 may be in direct contact with the mounting board 120. The encapsulant 124 is adjusted to a viscosity that allows for printing or dispenser coating, and can be cured by irradiation with light or by heat treatment. The shape of the encapsulant 124 can be, for example, approximately hemispherical, a vertically long convex shape in cross sectional view (i.e., a shape in which the length in the Z direction is greater than the length in the X direction in cross sectional view), a laterally long convex shape in cross sectional view (i.e., a shape in which the length in the X direction is greater than the length in the Z direction in cross sectional view), or a circular or elliptical shape in top view.

In this embodiment, an example was given in which a light source 103 consisted of one light emitting element 108 used for each of the areas divided by the walls 110A, but a single light source 103 may be constructed with a plurality of light emitting elements 108.

The plan view shape of the areas divided by the walls 110A is preferably polygonal. This makes it easier to divide up the emission area into the desired number with the walls 110A according to the surface area of the emission surface of the light emitting device. Examples of this shape include the square shown in FIG. 2, for instance, as well as a rectangular, hexagonal, etc.

The number of areas divided by the walls 110A can be set as desired, and the shape of the walls 110A and the positions of the light sources can be varied to suit the desired size.

In this embodiment, a configuration was discussed, which discourages or prevents light scattered by the diffuser sheet 130 from entering unlit areas. With the disclosure herein, in the case of light scattered at a prism sheets, a polarizing sheet, or another such optical member or a wavelength conversion sheet disposed on the upper side of the diffuser sheet 130 also, light would enter the unlit area can be reflected by the second reflector 104, therefore the contrast ratio can be increased.

In FIG. 1A, an example is illustrated in which the first reflectors 102 and the second reflector 104 are formed on the lower surface of the diffuser sheet 130, but the first reflectors 102 and the second reflector 104 may be disposed on either the upper surface or the lower surface of the diffuser sheet 130.

When light scattered within the diffuser sheet 130 is reflected upward by the second reflector 104, the second reflector 104 is preferably disposed on the lower surface of the diffuser sheet 130. Also, when light scattered by a member that is positioned higher than the diffuser sheet 130 is reflected upward by the second reflector 104, the second reflector 104 may be disposed on the upper surface of the diffuser sheet 130.

Also, the first reflectors 102 may be formed on the lower surface or the upper surface of the diffuser sheet 130. In the case of positioning on the upper surface, the distance over which light is diffused can be increased by an amount equal to the thickness of the diffuser sheet 130. Also, the reflectivity of the first reflectors 102 may be lower after scattering by the diffuser sheet 130, so the luminance reduction ratio can be decreased. FIGS. 1B and 1E show examples in which the first reflectors 102 and the second reflector 104 are formed on the upper surface of the diffuser sheet 130. As shown in FIG. 1D, the first reflectors 103 may be provided on the upper surface of the diffuser sheet 130, and the second reflector 104 may be formed on the lower surface of the diffuser sheet 130, so that reflectors are provided on both the upper surface and the lower surface. When the second reflector 104 is formed on the upper surface of the diffuser sheet 130, the diffuser sheet 130 may be disposed in contact with one or more of the top parts 110B. In this case, the luminance reduction ratio can be decreased, while further raising the contrast ratio.

As shown in FIG. 1C, a surface-light emitting device that is used as a light source for a direct-lit backlight can be obtained by disposing a prism sheet (a first prism sheet 150 and a second prism sheet 160), a polarizing sheet 170, or other such optical member above while having a specific distance away from the light emitting device of the embodiment described above, and disposing a liquid crystal panel over this.

Second Embodiment

Figure 6:
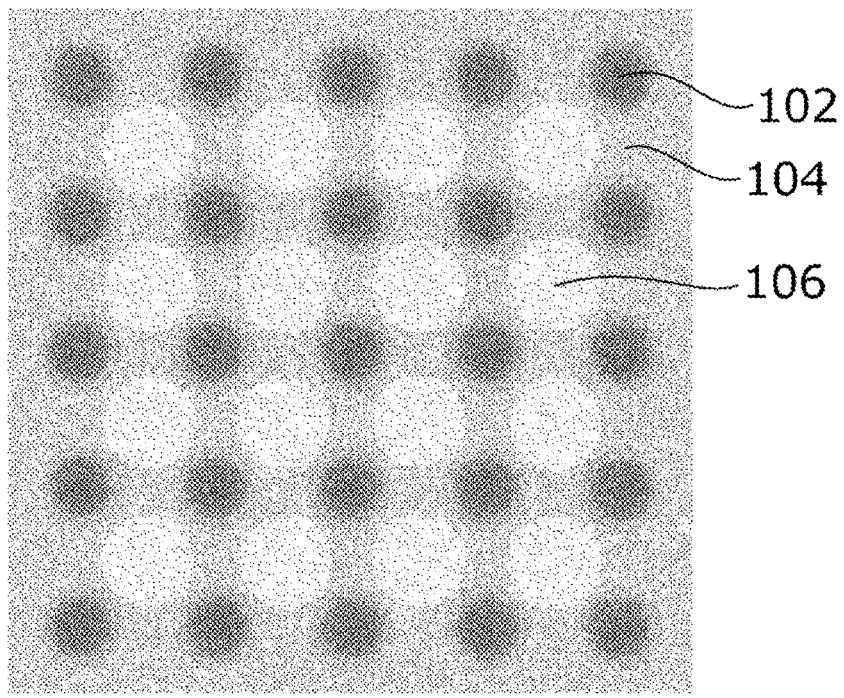
FIG. 6 is schematic diagrams showing an example of a reflection pattern with a diffuser sheet of a second embodiment of the present disclosure.
Figure 7:
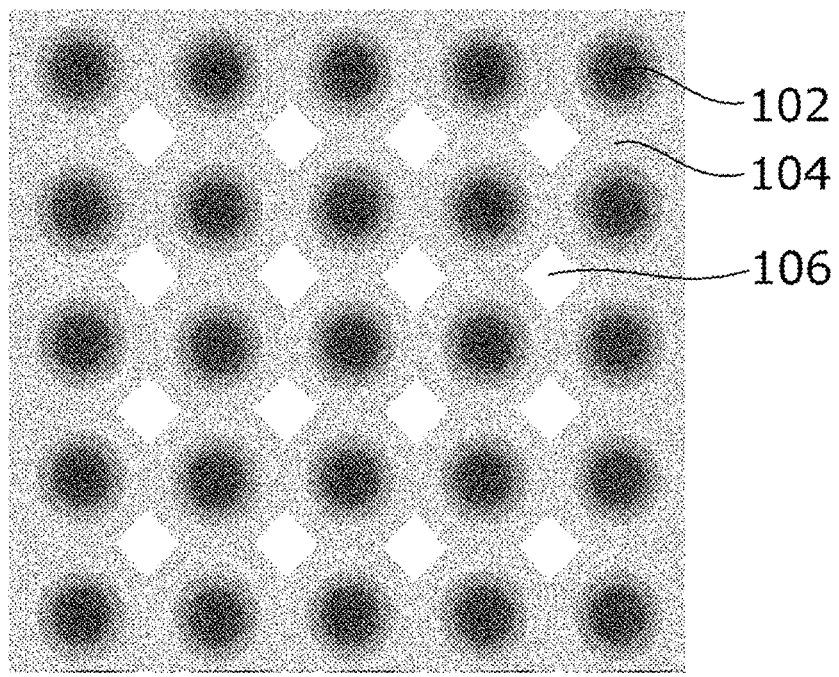
FIG. 7 is schematic diagrams showing an example of another reflection pattern with a diffuser sheet of the second embodiment of the present disclosure.

In a second embodiment, as shown in FIGS. 6 and 7, the reflective pattern formed on the diffuser sheet 130 is a reflective pattern having third reflectors 106. The third reflectors 106 are disposed directly above the areas (i.e., intersecting areas) where the top parts 110B intersect. The areas where the top parts 110B intersect are the areas indicated by dotted line A in FIG. 2, and shall be regarded as the area near an intersection point of top parts disposed in a matrix. The third reflectors 106 preferably have a lower reflectivity than the second reflector 104. When the diffuser sheet 130 is in contact with the top parts 110B, among the top parts 110B on which small amount of light from the light sources 103 is irradiated, the places where the top parts 110B intersect are darker than the places where there is no intersection. In view of this, non-uniform luminance within the lit area during local dimming can be reduced by making the reflectivity of the third reflectors 106 lower than that of the second reflector, thus the contrast ratio can be increased. However, in the case that the diffuser sheet 130 is disposed a position higher than the top parts 110B by using support pins or the like, the places where the top parts 110B intersect are irradiated by light from the light sources 103 disposed in four directions surrounding the intersecting sites, so that there are some sites brighter than sites where there is no intersection. In such a case, making the reflectivity of the third reflectors 106 greater than that of the second reflector can reduce non-uniform luminance within the lit area during local dimming, thus the contrast ratio can be improved.

Third Embodiment

Figure 8:
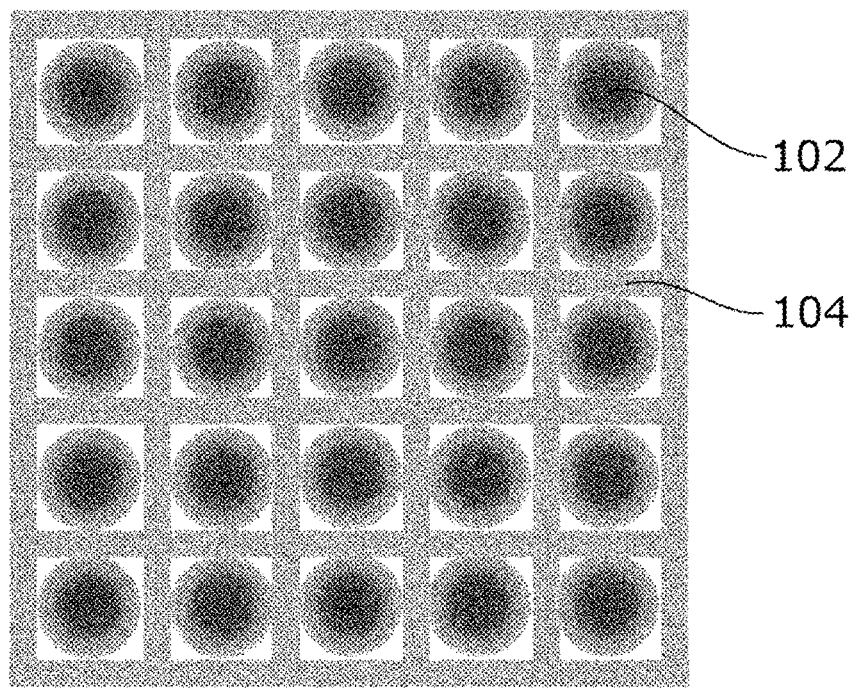
FIG. 8 is schematic diagrams showing an example of a reflection pattern with a diffuser sheet of a third embodiment of the present disclosure.

As shown in FIG. 8, in this third embodiment, the second reflector 104 is formed in a lattice shape. This lattice-shaped second reflector 104 is disposed along the top parts 110B. Consequently, light emitted from the light sources 103, which repeatedly reflects and scatters at the first reflectors 102, the second reflector 104, and the partitioning member 110, tends to escape from sites between the second reflector 104 and the first reflectors 102, and it is less likely to decrease the luminance of the lit area. This discourages a luminance reduction due to light reflection at the reflectors, and allows the contrast ratio to be increased with the second reflector 104.

Fourth Embodiment

In the fourth embodiment, a wavelength conversion sheet 140 that converts the light from the light sources 103 into light having a different wavelength is provided above the diffuser sheet 130, as shown in FIG. 1C. In this case, the first reflectors 102 contain a light absorbing material that absorbs at least part of the wavelength of the light from the light sources 103. At portions where the distance between the light sources 103 and the wavelength conversion sheet is short, that is, at the places where the first reflectors 102 are disposed, light is incident perpendicularly to the wavelength conversion sheet, whereas at portions that are farther away from the light sources, the light is incident obliquely to the wavelength conversion sheet. When light is incident obliquely with respect to perpendicular direction, the distance that light travels through the wavelength conversion sheet is longer and wavelength conversion is more likely to occur, whereas in the perpendicular direction, there is more light that passes directly through the wavelength conversion sheet, without experiencing wavelength conversion. In view of this, color non-uniformity in a surface light source can be reduced by adding a light absorbing material to the first reflectors 102.

Fifth Embodiment

In the fifth embodiment, a light absorbing material is added to the second reflector 104 in order to reduce color non-uniformity, in the same manner as the fourth embodiment. The light absorbing material in this embodiment should be regarded as a material absorbing at least part of the wavelength range of the light from the wavelength conversion sheet. This reduces color non-uniformity in a surface light source.

The materials that are used in the various constituent members of the light emitting devices in the various embodiments will now be described.

Mounting Board

The mounting board 120 is the member on which the light sources 103 are to be mounted. As shown in FIG. 3, it has the conductive wiring 126A and 126B for supplying power to the light emitting element 108 or other light sources.

The mounting board can be made of any material that allows at least the pair of conductive wiring 126A and 126B to be electrically insulated. Examples include ceramics, and phenol resins, epoxy resins, polyimide resins, BT resins, polyphthalamide (PPA), polyethylene terephthalate (PET), and other such resins. A so-called metal mounting board, in which an insulated layer is formed on a metal member, may also be used.

The thickness of the mounting board can be selected as needed. The mounting board may be a rigid mounting board or a flexible mounting board that can be manufactured by roll-to-roll method. A rigid mounting board may be a thin bendable rigid one.

Joining Member

The joining member is used to fix the light emitting element 108 to the mounting board or the conductive wiring. Examples of the joining member include insulating resins and conductive members. A conductive member is used in the case of the flip-chip mounting shown in FIG. 3. More specifically, examples include alloys containing Au, alloys containing Ag, alloys containing Pd, alloys containing In, alloys containing Pb—Pd, alloys containing Au—Ga, alloys containing Au—Sn, alloys containing Sn, alloys containing Sn—Cu, alloys containing Sn—Cu—Ag, alloys containing Au—Ge, alloys containing Au—Si, alloys containing Al, alloys containing Cu—In, and mixtures of a metal and a flux.

Light Reflecting Layer

The conductive wiring are preferably covered with the light reflecting layer 127, except for the portion that is electrically connected to the light emitting element 108 or other members. Specifically, as shown in FIG. 3, a resist for insulating and covering the conductive wiring may be disposed on the mounting board 120, and the light reflecting layer 127 can function as a resist. Adding a white filler (discussed below) to the resin material can discourage or prevent the leakage or absorption of light, thereby being able to improve the light extraction efficiency of the light emitting device.

Light Emitting Element

One of conventional elements can be used for the light emitting element 108. For example, a light emitting diode can be preferably used as the light emitting element 108. The wavelength of the light emitting element 108 can be selected as desired. For instance, a blue or green light emitting element can be one that makes use of a nitride semiconductor. A red light emitting element can be one that makes use of GaAlAs, AlInGaP, or the like. A semiconductor light emitting element composed of some other material can also be used. The composition, emission color, size, number, and so forth of the light emitting elements used can be suitably selected depending on the application.

Encapsulant

The encapsulant 124 may be disposed in such a manner as to cover the light emitting element for the purpose of protecting the light emitting element from the outside environment, optically controlling the light outputted from the light emitting element, or the like. A material of the encapsulant can be an epoxy resin, a silicone resin, a resin that is a mixture of these, or some other such light-transmissive resin, or glass, etc. Among those, it is preferable to choose a silicone resin by taking into account formability and light resistance.

Furthermore, the encapsulant can contain a wavelength conversion material that absorbs light from the light emitting element and re-emits light having a wavelength different from that of the output light from the light emitting element, for example a phosphor. The encapsulant can also contain a diffusing agent for diffusing the light from the light emitting element. Also, a colorant can be added depending on the emission color of the light emitting element.

The surface-light emitting device of the present disclosure can be used for a variety of light sources employed in light sources, for example, various kinds of indicators, display devices, and lighting.

What is claimed is:
1. A light emitting device comprising:
   a substrate;
   a plurality of light sources disposed on an upper surface of the substrate;
   a partitioning member disposed on the upper surface of the substrate and including top parts, the partitioning member being reflective;
   a diffuser sheet having a lower surface in contact with the top parts of the partitioning member; and a reflector disposed on an upper surface of the diffuser sheet at a position overlapping at least one of the top parts of the partitioning member in a top view.

2. The light emitting device according to claim 1, wherein each of the light sources includes a light emitting element and a light reflecting film formed on an upper surface of the light emitting element.

3. The light emitting device according to claim 2, wherein the light emitting element and the light reflecting film of each of the light sources are covered by a light-transmissive resin.

4. The light emitting device according to claim 1, wherein each of the light sources has a batwing light distribution.

5. The light emitting device according to claim 1, wherein the partitioning member includes resin containing
   metal oxide particles of at least one material selected from a group consisting of titanium oxide, aluminum oxide and silicon oxide, and
   a reflective material.

6. The light emitting device according to claim 1, wherein a height of the partitioning member is 8.0 mm or less.

7. The light emitting device according to claim 1, wherein a distance between the substrate and the diffuser sheet is 8.0 mm or less.

8. The light emitting device according to claim 1, wherein a distance between the substrate and the diffuser sheet is in a range of 2.0 mm to 8.0 mm.

9. The light emitting device according to claim 1, further comprising
   an optical member provided above the diffuser sheet.

10. The light emitting device according to claim 1, further comprising
    a wavelength conversion sheet positioned above the diffuser sheet and configured to convert the light from the light sources into light having a different wavelength.

11. The light emitting device according to claim 1, wherein
    the substrate is flexible.

12. The light emitting device according to claim 1, wherein
    each of the light sources is a packaged surface-mount light emitting device including a light emitting element.

13. The light emitting device according to claim 12, wherein
    the partitioning member includes resin containing
       metal oxide particles of at least one material selected from a group consisting of titanium oxide, aluminum oxide and silicon oxide, and
       a reflective material.

14. The light emitting device according to claim 12, wherein
    a height of the partitioning member is 8.0 mm or less.

15. The light emitting device according to claim 12, wherein
    a distance between the substrate and the diffuser sheet is 8.0 mm or less.

16. The light emitting device according to claim 12, wherein
    a distance between the substrate and the diffuser sheet is in a range of 2.0 mm to 8.0 mm.

17. The light emitting device according to claim 12, further comprising
    an optical member provided above the diffuser sheet.

18. The light emitting device according to claim 12, further comprising
    a wavelength conversion sheet positioned above the diffuser sheet and configured to convert the light from the light sources into light having a different wavelength.

19. The light emitting device according to claim 12, wherein
    the substrate is flexible.

20. The light emitting device according to claim 1, wherein
    the reflector has a lattice shape in the top view.

* * * * *